(12) United States Patent
Takeda et al.

(10) Patent No.: US 10,896,944 B2
(45) Date of Patent: Jan. 19, 2021

(54) ILLUMINATION LIGHTING APPARATUS, ILLUMINATION DEVICE, AND ILLUMINATION FIXTURE

(71) Applicant: Panasonic Intellectual Property Management Co., Ltd., Osaka (JP)

(72) Inventors: Teruhito Takeda, Hyogo (JP); Hirofumi Konishi, Osaka (JP); Shinji Makimura, Nara (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/580,096

(22) Filed: Sep. 24, 2019

(65) Prior Publication Data

US 2020/0105852 A1 Apr. 2, 2020

(30) Foreign Application Priority Data

Sep. 28, 2018 (JP) .................. 2018-186015

(51) Int. Cl.
| | |
|---|---|
| *G02B 6/42* | (2006.01) |
| *H01L 27/32* | (2006.01) |
| *H01L 27/15* | (2006.01) |
| *G09G 3/34* | (2006.01) |
| *H01L 27/24* | (2006.01) |

(52) U.S. Cl.
CPC ............ *H01L 27/3269* (2013.01); *G02B 6/42* (2013.01); *G09G 3/3406* (2013.01); *H01L 27/153* (2013.01); *H01L 27/24* (2013.01)

(58) Field of Classification Search
CPC .... H05B 37/02; H05B 37/0227; H05B 37/03; H05B 37/032; H05B 37/036; H05B 37/04; H05B 45/10; H05B 45/12; H05B 45/20; H05B 45/22; H05B 45/30; H05B 47/10; H05B 47/105; H05B 47/11; H05B 47/155; H05B 47/20; H05B 47/23; H05B 47/235; H05B 47/26; H05B 47/29; H01L 27/3269; G02B 6/42
See application file for complete search history.

(56) References Cited

U.S. PATENT DOCUMENTS

| | | | |
|---|---|---|---|
| 6,411,046 B1* | 6/2002 | Muthu | H05B 45/20 315/309 |
| 8,441,206 B2* | 5/2013 | Myers | H05B 45/22 315/291 |
| 2006/0256049 A1* | 11/2006 | Schou | H05B 45/37 345/82 |

(Continued)

FOREIGN PATENT DOCUMENTS

JP 2007-305929 A 11/2007

*Primary Examiner* — Jason Crawford
(74) *Attorney, Agent, or Firm* — Renner, Otto, Boisselle & Sklar, LLP

(57) ABSTRACT

An illumination lighting apparatus is configured to light a plurality of light-emitting elements connected in series to each other. The illumination lighting apparatus includes one photosensor and a detector. The one photosensor is configured to detect light emitted from the plurality of light-emitting elements. The detector is configured to perform detection of a light emission defect on the plurality of light-emitting elements based on the light detected by the one photosensor. Moreover, the detector performs the detection process at an initial stage of lighting of the plurality of light-emitting elements.

17 Claims, 7 Drawing Sheets

(56) References Cited

U.S. PATENT DOCUMENTS

| | | | |
|---|---|---|---|
| 2007/0273290 A1* | 11/2007 | Ashdown | F21V 29/717 315/113 |
| 2009/0016060 A1* | 1/2009 | Nakao | G02F 1/133603 362/276 |
| 2009/0079363 A1* | 3/2009 | Ghoman | H05B 45/22 315/294 |
| 2011/0043137 A1* | 2/2011 | Negley | H05B 45/28 315/297 |
| 2011/0084615 A1* | 4/2011 | Welten | H05B 45/22 315/152 |
| 2011/0266961 A1* | 11/2011 | Tsai | H05B 45/395 315/185 R |
| 2012/0306379 A1* | 12/2012 | Frost | H05B 45/22 315/151 |
| 2014/0015413 A1* | 1/2014 | Ito | H01S 5/06825 315/119 |
| 2017/0079109 A1* | 3/2017 | Matsui | H05B 45/00 |

* cited by examiner

ILLUMINATION LIGHTING APPARATUS, ILLUMINATION DEVICE, AND ILLUMINATION FIXTURE

CROSS-REFERENCE TO RELATED APPLICATION

The present application is based upon and claims the benefit of priority of Japanese Patent Application No. 2018-186015, filed on Sep. 28, 2018, the entire contents of which are incorporated herein by reference.

TECHNICAL FIELD

The present disclosure generally relates to illumination lighting apparatuses, illumination devices, and illumination fixtures. The present disclosure specifically relates to an illumination lighting apparatus configured to light a plurality of light-emitting elements connected in series to each other, an illumination device including the illumination lighting apparatus, and an illumination fixture including the illumination device.

BACKGROUND ART

As an illumination device including light-emitting diodes (LEDs) to be lit, an LED illumination device for detecting a failure of the LEDs has been known (e.g., see JP 2007-305929 A which is hereinafter referred to as "Document 1").

In the LED illumination device described in Document 1, field effect transistors (FETs) are inserted in parallel to all the LEDs. The LED illumination device described in Document 1 detects a failed LED of the LEDs and turns on the FET, so that a current flows while bypassing the failed LED.

In a conventional illumination device as described in Document 1, when a light-emitting element such as an LED fails so as to become an open circuit, a current no longer flows through the light-emitting element, and therefore, a light emission defect of the light-emitting element is detectable.

The conventional illumination device, however, has a problem that an oscillation defect of the light-emitting element is not detectable. The oscillation defect is that a light-emitting element emits no light although a current continues to flow through the light-emitting element. The "light emission defect of the light-emitting element" includes not only a defect that a current does not flow through the light-emitting element and thus the light-emitting element emits no light, but also the oscillation defect of the light-emitting element. The "oscillation defect of the light-emitting element" is a defect that a current continues to flow through a light-emitting element, but the light-emitting element emits no light due to a problem occurring in an oscillation operation of the light-emitting element. As a property of the light-emitting element, the oscillation defect may occur.

To solve the problem, the number of light-emitting elements connected in series to each other is increased, so that even when the oscillation defect of the light-emitting element occurs, the influence of the oscillation defect over the quantity of light emitted from the plurality of light-emitting elements can be reduced. However, increasing the number of light-emitting elements leads to a new problem, that is, increased cost.

SUMMARY

In view of the foregoing, it is an object of the present disclosure to provide an illumination lighting apparatus configured to accurately detect a light-emitting element having a light emission defect, an illumination device including the illumination lighting apparatus, and an illumination fixture including the illumination device.

An illumination lighting apparatus according to one aspect of the present disclosure is an illumination lighting apparatus configured to light a plurality of light-emitting elements connected in series to each other. The illumination lighting apparatus includes one photosensor and a detector. The one photosensor is configured to detect light emitted from the plurality of light-emitting elements. The detector is configured to perform a detection process of detecting a light emission defect in the plurality of light-emitting elements based on the light detected by the one photosensor. The detector is configured to perform the detection process at an initial stage of lighting of the plurality of light-emitting elements.

An illumination device according to one aspect of the present disclosure includes the illumination lighting apparatus, the plurality of light-emitting elements, and an optical component. The optical component is configured to guide the light emitted from the plurality of light-emitting elements.

An illumination fixture according to one aspect of the present disclosure includes the illumination device and a light outputting section. The light outputting section is configured to output the light guided from the optical component of the illumination device.

BRIEF DESCRIPTION OF THE DRAWINGS

The figures depict one or more implementation in accordance with the present teaching, by way of example only, not by way of limitations. In the figures, like reference numerals refer to the same or similar elements.

FIG. 7 is a schematic view illustrating a function when a power supply of the illumination lighting apparatus is turned on;

DETAILED DESCRIPTION

An illumination lighting apparatus, an illumination device, and an illumination fixture of an embodiment will be described below with reference to the drawings. Figures described in the following embodiment and the like are schematic views, and the ratio of sizes and the ratio of thicknesses of components in the figures do not necessarily reflect actual dimensional ratios.

Embodiment (1) Overall Configuration of Illumination Lighting Apparatus

An overall configuration of an illumination lighting apparatus of the present embodiment will be described with reference to the drawings.

Figure 1:
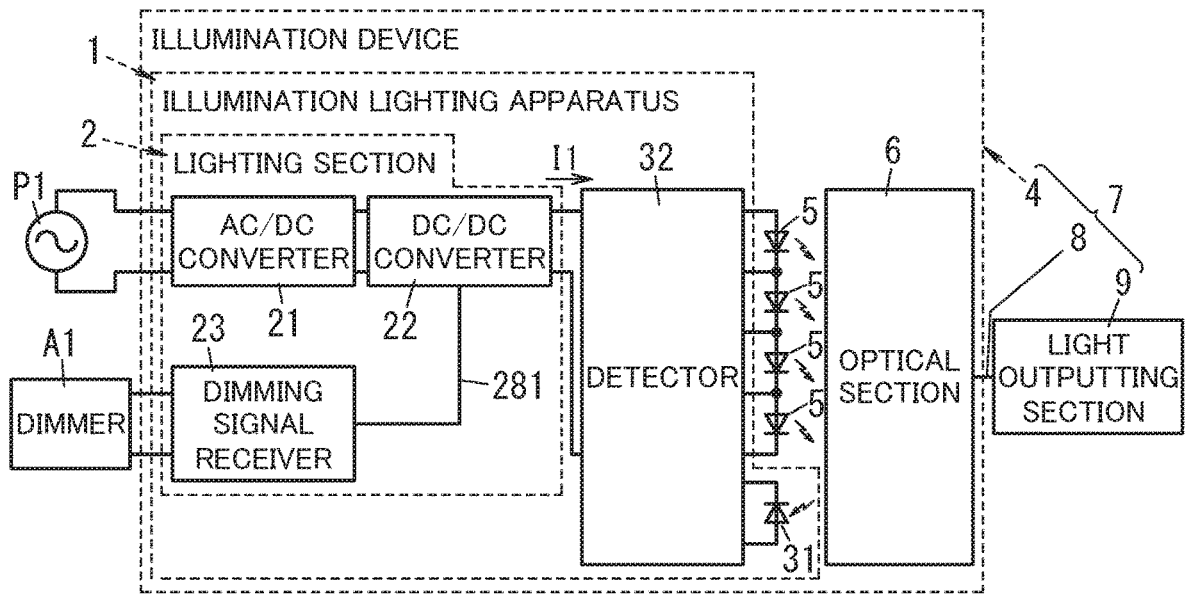
FIG. 1 is a schematic view illustrating an illumination fixture of an embodiment.

As illustrated in FIG. 1, an illumination lighting apparatus 1 includes a lighting section 2, one photosensor 31, and a detector 32. The illumination lighting apparatus 1 is an apparatus configured to light (turn on) a plurality of (in the example shown in the figure, four) light-emitting elements 5 connected in series to each other. The illumination lighting apparatus 1, together with the plurality of light-emitting elements 5, forms an illumination device 4.

The illumination lighting apparatus 1 is used, for example, in an underwater illumination fixture for emitting light in water or a headlamp of an automobile.

(2) Illumination Device

Figure 6:
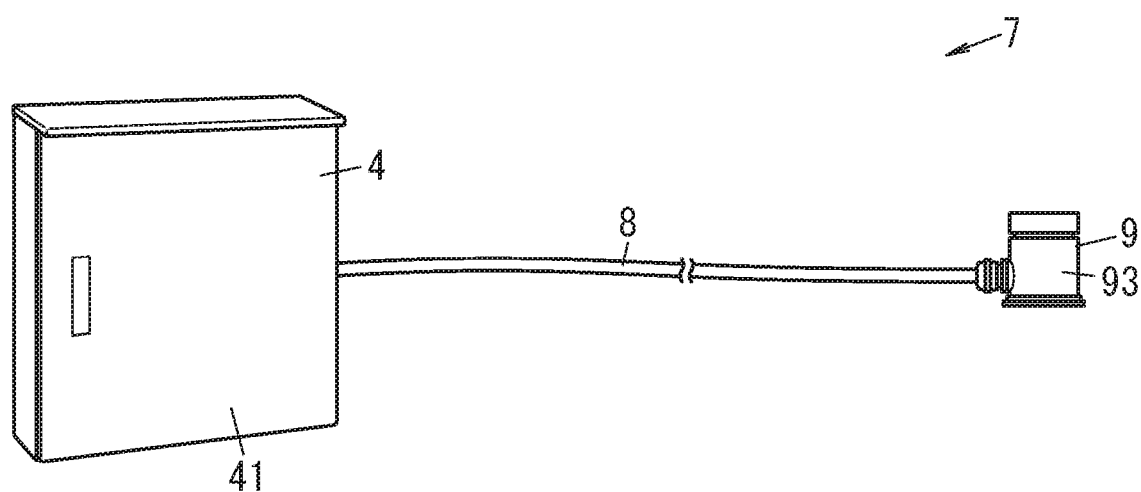
FIG. 6 is an exterior view illustrating the illumination fixture.

As illustrated in FIG. 1, the illumination device 4 includes the illumination lighting apparatus 1, the plurality of (in the example shown in the figure, four) light-emitting elements 5, and an optical section 6. As illustrated in FIG. 6, the illumination device 4 further includes a housing 41. The housing 41 accommodates the illumination lighting apparatus 1, the plurality of light-emitting elements 5, and the optical section 6.

The illumination device 4 is used together with a light outputting section 9 which will be described later. The illumination device 4 may be used in an underwater illumination fixture or a headlamp of an automobile as described above.

(2.1) Light-Emitting Element

The plurality of light-emitting elements 5 shown in FIG. 1 are, for example, laser diodes and are connected in series to each other. In the example as shown in more detail in FIG. 4, the plurality of light-emitting elements 5 are a first light-emitting element 51, a second light-emitting element 52, a third light-emitting element 53, and a fourth light-emitting element 54. Each light-emitting element 5 emits, for example, blue light.

(2.2) Optical Section

Figure 5:
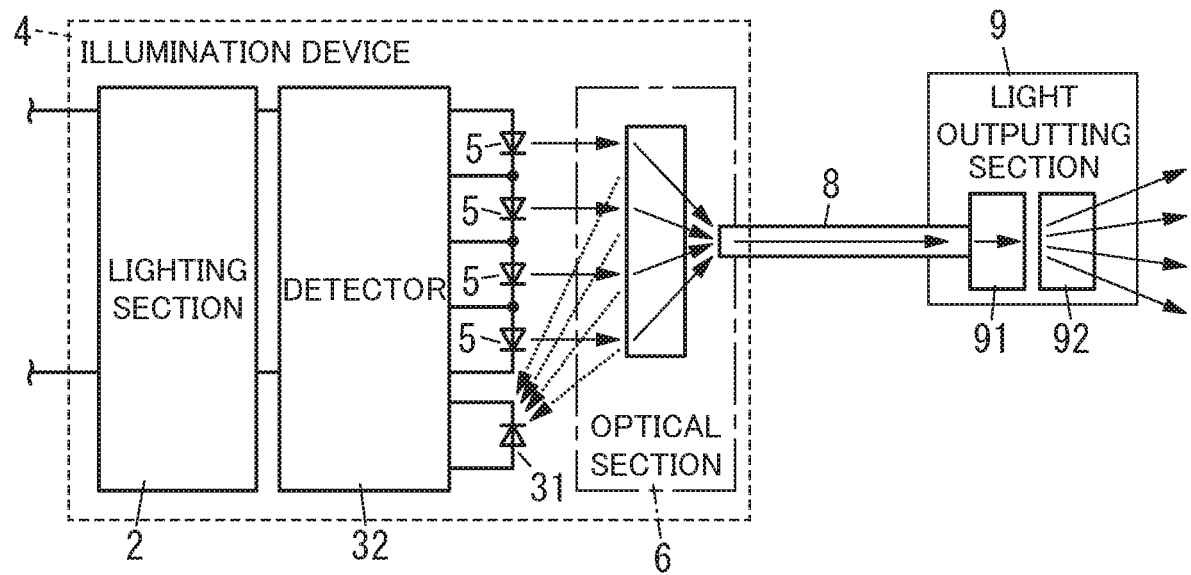
FIG. 5 is a schematic view illustrating a function of the illumination fixture.

As illustrated in FIG. 5, the optical section 6 is configured to guide light emitted from the plurality of light-emitting elements 5. The optical section 6 includes at least one optical component such as an optical lens or the like, and is configured to collect the light emitted from the plurality of light-emitting elements 5. The optical section 6 is connected to an optical fiber 8 which will be described later. The light collected by the optical section 6 enters the optical fiber 8 from the optical section 6 and is output to the outside of the illumination device 4.

(3) Illumination Fixture

As illustrated in FIG. 5, an illumination fixture 7 includes the illumination device 4, the optical fiber 8, and the light outputting section 9.

(3.1) Optical Fiber

As illustrated in FIG. 5, the optical fiber 8 optically connects the illumination device 4 to the light outputting section 9. The optical fiber 8 transmits the light guided from the optical section 6 of the illumination device 4.

(3.2) Light Outputting Section

As illustrated in FIG. 5, the light outputting section 9 outputs the light transmitted from the optical fiber 8. The light outputting section 9 includes an optical conversion member 91 and a luminous intensity distribution optical system 92. As illustrated in FIG. 6, the light outputting section 9 further includes a housing 93. The housing 93 accommodates the optical conversion member 91 and the luminous intensity distribution optical system 92.

The optical conversion member 91 is a member made of a light transmissive material containing phosphor mixed therein. The phosphor is, for example, yellow phosphor. The yellow phosphor is, for example, $Y_3Al_5O_{12}$ activated with Ce or $Ba_2SiO_4$ activated with Eu. The phosphor is excited by part of the blue light output from the illumination device 4 and coming through the optical fiber 8, thereby emitting yellow light. The optical conversion member 91 outputs white light which is mixed-color light of the remaining part of the blue light and the yellow light.

The luminous intensity distribution optical system 92 includes at least one optical component and performs luminous intensity distribution control of the white light output from the optical conversion member 91 to output the white light to the outside of the light outputting section 9.

(4) Components of Illumination Lighting Apparatus

Components of the illumination lighting apparatus 1 will be described below with reference to the drawings.

(4.1) Lighting Section

As illustrated in FIG. 1, the lighting section 2 includes an AC/DC converter 21, a DC/DC converter 22, and a dimming signal receiver 23. The lighting section 2 further has a dimming function for turning on and dimming the plurality of light-emitting elements 5.

(4.1.1) AC/DC Converter

As illustrated in FIG. 1, the AC/DC converter 21 is electrically connected to a power supply P1 and receives a voltage from the power supply P1. The power supply P1 is, for example, a commercial AC power supply (AC 100 V 50/60 Hz, AC 200 V 50/60 Hz, or the like). The AC/DC converter 21 is configured to output a constant voltage to the DC/DC converter 22. The constant voltage is a direct current voltage required by the plurality of light-emitting elements 5. The AC/DC converter 21 is configured to set an output voltage to be output to the DC/DC converter 22 to a voltage, such as DC 60 V or DC 30 V, higher than or equal to a voltage (e.g., DC 20 V) required by the light-emitting elements 5.

Figure 2:
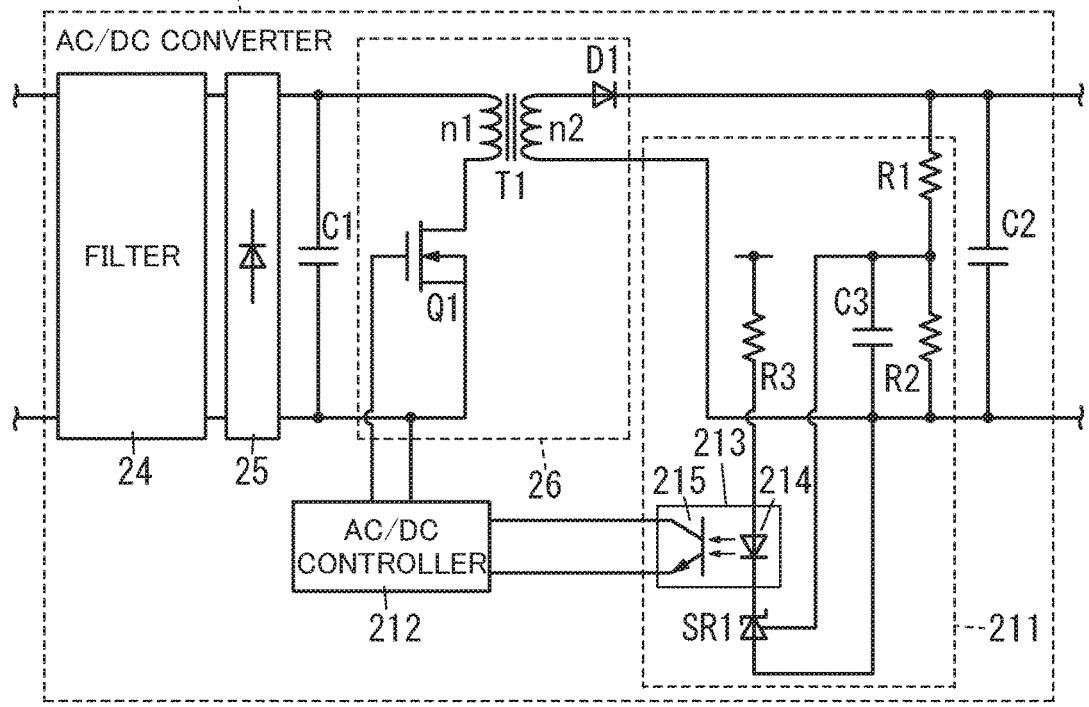
FIG. 2 is a circuit diagram illustrating an AC/DC converter in an illumination lighting apparatus of the illumination fixture.

As illustrated in FIG. 2, the AC/DC converter 21 includes a filter 24, a rectifier circuit 25, a smoothing capacitor C1, and a step-up circuit 26. The AC/DC converter 21 includes a voltage detection circuit 211 and an AC/DC controller 212. The AC/DC converter 21 is, for example, an isolated flyback converter of a constant voltage output.

The filter 24 is electrically connected to both ends of the power supply P1 and is configured to reduce noise on a power supply line.

The rectifier circuit 25 is, for example, a diode bridge and is configured to rectify an alternating-current voltage from the power supply P1. A pulsating voltage rectified is applied to the smoothing capacitor C1.

The smoothing capacitor C1 is electrically connected between outputs of the rectifier circuit 25 and is configured to smooth the pulsating voltage rectified by the rectifier circuit 25. A direct-current voltage smoothed by the smoothing capacitor C1 is output to the step-up circuit 26.

The step-up circuit 26 is a flyback converter circuit and is configured to step up the direct-current voltage smoothed by the smoothing capacitor C1. The step-up circuit 26 includes a transformer T1, a switching element Q1, a diode D1, and a smoothing capacitor C2.

The transformer T1 includes a primary winding wire n1 and a secondary winding wire n2. The transformer T1 is an isolated flyback transformer configured to electrically insulate an input side connected to the primary winding wire n1 from an output side connected to the secondary winding wire n2. The primary winding wire n1 is electrically connected to both ends of the smoothing capacitor C1. The secondary winding wire n2 is electrically connected to an input end of the DC/DC converter 22 (see FIG. 1).

The switching element Q1 is, for example, an n-channel enhancement metal-oxide-semiconductor field-effect transistor (MOSFET). Between the both ends of the smoothing capacitor C1, the switching element Q1 is connected in series to the primary winding wire n1 of the transformer T1. When the switching element Q1 is a MOSFET, the switching element Q1 has a drain connected to the primary winding wire n1 of the transformer T1, and the switching element Q1 has a source electrically connected to a low-voltage side of the smoothing capacitor C1.

The diode D1 is connected in series to the secondary winding wire n2 of the transformer T1. Specifically, the diode D1 has an anode electrically connected to the secondary winding wire n2 of the transformer T1, and the diode D1 has a cathode electrically connected to the smoothing capacitor C2.

The smoothing capacitor C2 is connected in parallel to a series circuit of the secondary winding wire n2 of the transformer T1 and the diode D1. The smoothing capacitor C2 is configured to smooth a voltage induced across the secondary winding wire n2 of the transformer T1.

The voltage detection circuit 211 includes a plurality of (in the example shown in the figure, two) resistors R1 and R2, a capacitor C3, a shunt regulator SR1, and a photocoupler 213.

The plurality of resistors R1 and R2 are connected in parallel to the series circuit of the secondary winding wire n2 of the transformer T1 and the diode D1. Specifically, the plurality of resistors R1 and R2 are connected to a connection point of the smoothing capacitor C2 to the series circuit of the secondary winding wire n2 of the transformer T1 and the diode D1. That is, the plurality of resistors R1 and R2 are connected in parallel to the smoothing capacitor C2.

The capacitor C3 is connected in series to the resistor R1 and is connected in parallel to the resistor R2 at both ends of the series circuit of the secondary winding wire n2 of the transformer T1 and the diode D1.

The shunt regulator SR1 is connected between the photocoupler 213 and a low-voltage side of the plurality of resistors R1 and R2. The shunt regulator SR1 has a control terminal electrically connected to a connection point of the resistor R1 to the resistor R2. That is, the shunt regulator SR1 is electrically connected between the resistor R1 and the capacitor C3.

The photocoupler 213 includes a light-emitting diode 214 serving as a light-emitting element and a phototransistor 215 serving as a light reception element. The light-emitting diode 214 has an anode electrically connected to a resistor R3, and the light-emitting diode 214 has a cathode electrically connected to the shunt regulator SR1. The light-emitting diode 214 receives a voltage applied from a control power supply via the resistor R3.

The AC/DC controller 212 performs, based on a voltage across the secondary winding wire n2 of the transformer T1, control of turning on and off of the switching element Q1. Specifically, the AC/DC controller 212 is, for example, a control integrated circuit (IC). The phototransistor 215 of the photocoupler 213 is electrically connected to the AC/DC controller 212. The AC/DC controller 212 is configured to adjust a control signal to the switching element Q1 in accordance with an output of the photocoupler 213.

(4.1.2) DC/DC Converter

Figure 3:
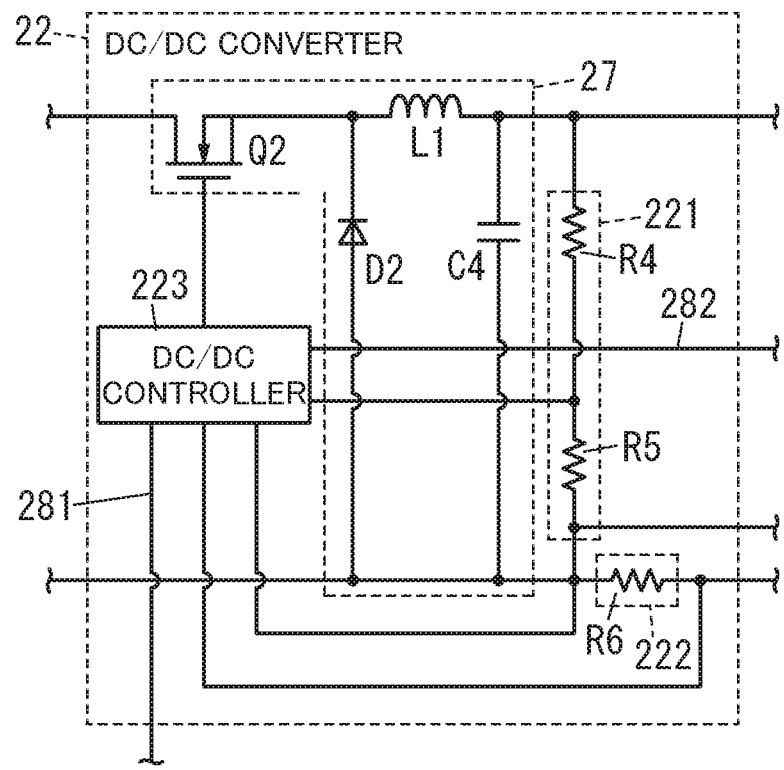
FIG. 3 is a circuit diagram illustrating a DC/DC converter in the illumination lighting apparatus of the illumination fixture.

As illustrated in FIG. 3, the DC/DC converter 22 includes a step-down circuit 27. The DC/DC converter 22 includes a voltage detection circuit 221, a current detection circuit 222, and a DC/DC controller 223. The DC/DC converter 22 is, for example, a step-down chopper converter of a constant current output.

The step-down circuit 27 includes a switching element Q2, an inductor L1, a diode D2, and a capacitor C4.

The switching element Q2 is, for example, an n-channel enhancement MOSFET and is electrically connected to a high-voltage-side output end of the AC/DC converter 21 (see FIG. 2).

The inductor L1 is connected in series to the switching element Q2.

The diode D2 is connected in series to the switching element Q2 between outputs of the AC/DC converter 21. Specifically, the diode D2 has an anode electrically connected to a low-voltage side output end of the AC/DC converter 21. The diode D2 has a cathode electrically connected to a connection point of the switching element Q2 to the inductor L1.

Between the output ends of the AC/DC converter 21, the capacitor C4 is connected in parallel to a series circuit of the switching element Q2 and the inductor L1. The capacitor C4 is configured to smooth a voltage stepped down by the switching element Q2, the inductor L1, and the diode D2.

The voltage detection circuit 221 includes a plurality of (in the example sown in the figure, two) resistors R4 and R5. The plurality of resistors R4 and R5 are connected in series to each other between both ends of the capacitor C4. That is, the plurality of resistors R4 and R5 are connected in parallel to the capacitor C4. The plurality of resistors R4 and R5 enable the voltage value of a voltage smoothed by the capacitor C4 to be detected.

The current detection circuit 222 includes a resistor R6. The resistor R6 is connected between a low-voltage side input end of the DC/DC converter 22 and a low-voltage side output end of the DC/DC converter 22. That is, the resistor R6 is electrically connected between the low-voltage side input end of the DC/DC converter 22 and the low-voltage side output end of the DC/DC converter 22. The resistor R6 enables the current value of a current output from the DC/DC converter 22 to be detected.

The DC/DC controller 223 controls turning on and off of the switching element Q2 based on an output voltage of the DC/DC converter 22 and a current I1 (see FIG. 1) output from the DC/DC converter 22. Specifically, the DC/DC controller 223 is, for example, a control IC. The DC/DC controller 223 adjusts a control signal to the switching element Q2 in accordance with an output of the voltage detection circuit 221 and an output from the current detection circuit 222.

The DC/DC converter 22 having the configuration as described above receives the constant voltage output from the AC/DC converter 21 (see FIG. 2) to perform a constant current output. The current value of the current I1 output from the DC/DC converter 22 is set by an output level of the dimming signal receiver 23 (see FIG. 1). When the dimming level is 100%, the DC/DC converter 22 outputs a rated current of the light-emitting elements 5. When the dimming level is 50%, the DC/DC converter 22 outputs a current which is half the rated current of the light-emitting elements 5. In the case of pulse width modulation (PWM) control, the current value of the current I1 output from the DC/DC converter 22 is the rated current of the light-emitting elements 5. When the dimming level is 100%, the DC/DC converter 22 outputs the current I1 with a duty ratio of 100%. When the dimming level is 50%, the DC/DC converter 22 outputs the current I1 with a duty ratio of 50%.

Note that when the voltage of the light-emitting elements 5 is lower than the output voltage of the AC/DC converter 21, a step-down circuit such as a step-down chopper circuit is provided in the DC/DC converter 22. On the other hand, when the voltage of the light-emitting elements 5 is higher than the output voltage of the AC/DC converter 21, a step-up circuit such as a step-up chopper circuit is provided in the DC/DC converter 22. Alternatively, when there are two possible cases, namely, a case where the voltage of the light-emitting element 5 may be higher than the output voltage of the AC/DC converter 21 and a case where the voltage of the light-emitting element 5 may be lower than the output voltage of the AC/DC converter 21, a step-up/step-down circuit such as a step-up/step-down chopper circuit is provided in the DC/DC converter 22. In the present disclosure, "the voltage of the light-emitting element 5" refers to a voltage required to light the plurality of light-emitting elements 5.

(4.1.3) Dimming Signal Receiver

As illustrated in FIG. 1, the dimming signal receiver 23 receives a lighting control signal from a dimmer A1. In the present disclosure, the lighting control signal is, for example, a turn-on signal for turning on the plurality of light-emitting elements 5, a turn-off signal for turning off the plurality of light-emitting elements 5, or a dimming signal for turning on and dimming the plurality of light-emitting elements 5. The dimming signal includes a dimming level and is transmitted based on, for example, a PWM system from the dimmer A1. For example, as the duty ratio (the ratio of ON time period to one cycle) decreases, the dimming level (quantity of light) increases, and as the duty ratio increases, the dimming level decreases. The dimming signal receiver 23 outputs control contents of the lighting control signal thus received to the DC/DC controller 223 (see FIG. 3) of the DC/DC converter 22. More specifically, the dimming signal receiver 23 outputs control contents of the lighting control signal via a control line 281 to the DC/DC controller 223.

(4.2) Photosensor

Figure 4:
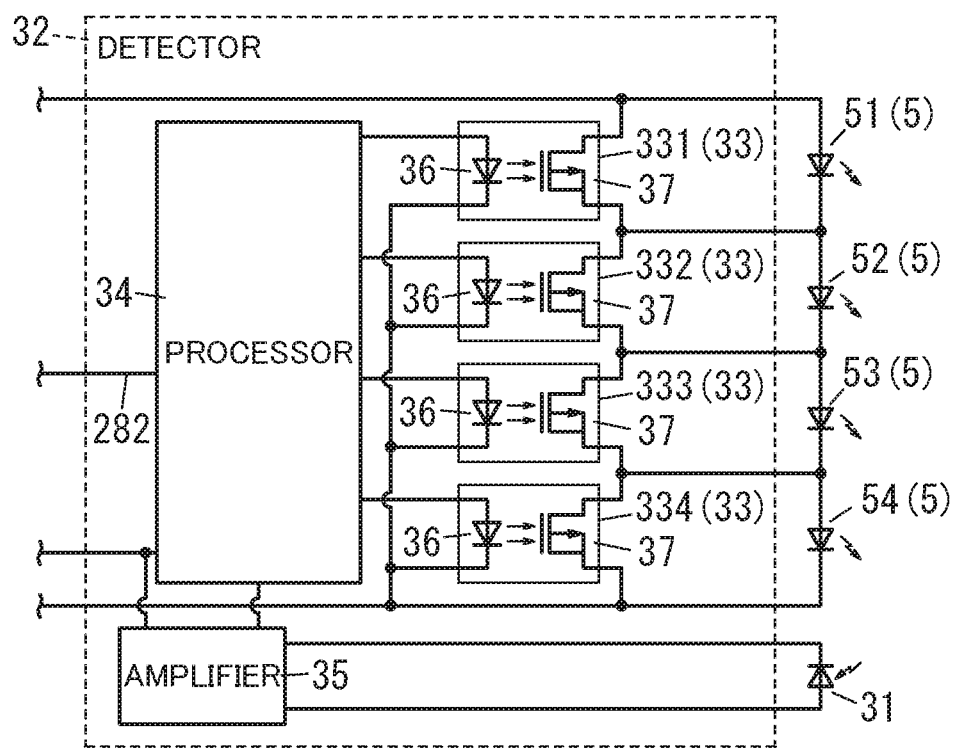
FIG. 4 is a circuit diagram illustrating a photosensor and a detector in the illumination lighting apparatus of the illumination fixture.

As illustrated in FIG. 4, the photosensor 31 is a single sensor and is configured to detect light emitted from the plurality of light-emitting elements 5. The photosensor 31 is, for example, a photodiode. The photosensor 31 detects part of the light emitted from the plurality of light-emitting elements 5. Specifically, as illustrated in FIG. 5, the photosensor 31 detects light reflected off the optical section 6 of the light emitted from the plurality of light-emitting elements 5. The photosensor 31 is electrically connected to the detector 32, and a detection result by the photosensor 31 is output to the detector 32.

(4.3) Detector

As illustrated in FIG. 1, the detector 32 detects a light emission defect of the plurality of light-emitting elements 5 based on the light detected by the photosensor 31. The detector 32 is provided between the lighting section 2 and a set of the plurality of light-emitting elements 5. Specifically, the detector 32 is provided between the DC/DC converter 22 of the lighting section 2 and a set of the plurality of light-emitting elements 5.

In the present disclosure, "a light emission defect of a light-emitting element 5" includes not only a defect that a current does not flow through the light-emitting element 5 and the light-emitting element 5 emits no light, but also an oscillation defect that a current continues to flow through the light-emitting element 5 but a problem occurs in the oscillation operation of the light-emitting element 5 and thus the light-emitting element 5 emits no light. Moreover, a state described by "the light-emitting element 5 outputs no light" includes not only a state where the light-emitting element 5 emits no light but also a state where the light-emitting element 5 does not emit expected light.

As illustrated in FIG. 4, the detector 32 includes two or more (in the example shown in the figure, four) switches 33, a processor 34, and an amplifier 35.

(4.3.1) Switches

The two or more switches 33 are connected in parallel to the plurality of light-emitting elements 5. Each switch 33 is, for example, a semiconductor relay (solid state relay) and includes a light-emitting diode 36 serving as a light-emitting element and a phototransistor 37 serving as a light reception element. The phototransistors 37 of the two or more switches 33 are connected in series to each other between the output ends of the DC/DC converter 22 of the lighting section 2. Moreover, in each switch 33, the light-emitting diode 36 is connected to the processor 34, and the phototransistor 37 is connected in parallel to the light-emitting element 5. The light-emitting diode 36 has an anode connected to the processor 34, and the light-emitting diode 36 has a cathode electrically connected to the low-voltage side output end of the DC/DC converter 22 (see FIG. 3). The light-emitting diode 36 of each switch 33 is controlled by the processor 34 to turn on and off the phototransistor 37.

In the present embodiment, the two or more switches 33 correspond to the plurality of light-emitting elements 5 on a one-to-one basis and are each connected in parallel to a corresponding one of the light-emitting elements 5. In the example shown in FIG. 4, the two or more switches 33 are a first switch 331, a second switch 332, a third switch 333, and a fourth switch 334. The first switch 331 corresponds to the first light-emitting element 51, and the second switch 332 corresponds to the second light-emitting element 52. The third switch 333 corresponds to the third light-emitting element 53, and the fourth switch 334 corresponds to the fourth light-emitting element 54.

In each switch 33, when the phototransistor 37 is in an OFF state, a current flows through the corresponding one of the light-emitting elements 5. However, when the phototransistor 37 is in an ON state, both ends of the corresponding one of the light-emitting elements 5 are short-circuited, and therefore, no current flows through the corresponding one of the light-emitting elements 5. For example, when the phototransistor 37 of the first switch 331 is in the OFF state, a current flows through the first light-emitting element 51. However, when the phototransistor 37 of the first switch 331 is in the ON state, no current flows through the first light-emitting element 51. Similarly, when the phototransistor 37 of the second switch 332 is in the OFF state, a current flows through the second light-emitting element 52. However, when the phototransistor 37 of the second switch 332 is in the ON state, no current flows through the second light-emitting element 52. When the phototransistor 37 of the third switch 333 is in the OFF state, a current flows to the third light-emitting element 53. However, when the phototransistor 37 of the third switch 333 is in the ON state, no current flows through the third light-emitting element 53. When the phototransistor 37 of the fourth switch 334 is in the OFF state, a current flows through the fourth light-emitting element 54. However, when the phototransistor 37 of the fourth switch 334 is in the ON state, no current flows through the fourth light-emitting element 54.

(4.3.2) Amplifier

The amplifier 35 is an amplifier configured to amplify an output of the photosensor 31. The amplifier 35 amplifies the output of the photosensor 31 and outputs the output to the processor 34.

(4.3.3) Processor

The processor 34 is, for example, a microcontroller and is configured to control the two or more switches 33. Specifically, the processor 34 individually controls turning on and off of the two or more switches 33 to control current supply to each of the plurality of light-emitting elements 5.

If, when the processor 34 turns on the two or more switches 33 sequentially one by one, the quantity of light detected by the photosensor 31 does not change, the processor 34 detects a light emission defect occurring in the plurality of light-emitting elements 5. In other words, if, when the processor 34 turns on the two or more switches 33 sequentially one by one, the quantity of light detected by the photosensor 31 does not change, the processor 34 detects a light-emitting element 5 of the plurality of light-emitting elements 5 which has a light emission defect. More details will be described below.

In a time period for detection of a light emission defect, the processor 34 turns on sequentially one by one the two or more switches 33 corresponding to the plurality of light-emitting elements 5 on a one-to-one basis, and the photosensor 31 detects light emitted from the plurality of light-emitting elements 5. The processor 34 acquires a detection value by the photosensor 31 via the amplifier 35. The processor 34 detects a change of the light emitted from the plurality of light-emitting elements 5 during the time period for detection of the light emission defect.

It is assumed that in each of the plurality of light-emitting elements 5, a light-emitting element 5 is normal. In this case, when a corresponding one of the switches 33 is turned on to short-circuit the both ends of the light-emitting element 5, the light-emitting element 5 no longer emits light. This reduces light emitted from the plurality of light-emitting elements 5. That is, the detection value by the photosensor 31 becomes smaller than that before the both ends of the light-emitting element 5 are short-circuited.

On the other hand, when a light-emitting element 5 has a light emission defect, the light-emitting element 5 having the light emission defect may have an oscillation defect that no light is emitted although a current flows through the light-emitting element 5. That is, even when the switch 33 corresponding to the light-emitting element 5 having the oscillation defect is turned on to short-circuit the both ends of the light-emitting element 5 having the oscillation defect, the light-emitting element 5 having the oscillation defect still outputs no light similarly to the light-emitting element 5 before the both ends of the light-emitting element 5 having the oscillation defect are short-circuited. Thus, before and after the switch 33 corresponding to the light-emitting element 5 having the oscillation defect is turned on and off, the light emitted from the plurality of light-emitting elements 5 does not change. Thus, before and after the switch 33 corresponding to the light-emitting element 5 having the oscillation defect is turned on, the detection value by the photosensor 31 does not change. The processor 34 detects, as the light-emitting element 5 having the light emission defect, a light-emitting element 5 for which the detection value by the photosensor 31 does not change before and after the switch 33 is turned on.

As described above, the two or more switches 33 corresponding to the plurality of light-emitting elements 5 are turned on sequentially one by one, and the quantity of light emitted from the plurality of light-emitting elements 5 is measured by the photosensor 31, which enables the light-emitting element 5 having a light emission defect to be detected from the plurality of light-emitting elements 5.

In the present embodiment, the processor 34 detects a light-emitting element 5 having a light emission defect with reference to a threshold. The processor 34 turns on the two or more switches 33 sequentially one by one, and when any of the two or more switches 33 is switched between the OFF state and the ON state but the quantity of light detected by the photosensor 31 remains larger than or equal to the threshold, the processor 34 detects a light-emitting element 5 having a light emission defect. That is, the processor 34 detects the light-emitting element 5 having the light emission defect when the quantity of light remains larger than or equal to the threshold before and after the switch 33 is turned on.

The threshold is stored in a storage section, such as memory, of the processor 34 in advance. Here, the threshold is a value lower than the quantity of light detected most recently (e.g., before the switch 33 is turned on) by the photosensor 31. Note that an initial value of the threshold is larger than or equal to the quantity of light detected by the photosensor 31 in a case where no light is emitted from one light-emitting element 5 of the plurality of light-emitting elements 5, and the initial value is smaller than the quantity of light detected by the photosensor 31 in a case where all the plurality of light-emitting elements 5 emit light. For example, 90% of the detection value by the photosensor 31 is the threshold, but the threshold is a value which is changed depending on the location of the photosensor 31. Moreover, the threshold is a value which is changed also by the number of light-emitting elements 5.

Here, a switching interval at which the processor 34 turns on the two or more switches 33 sequentially one by one will be described. The switching interval is a time from a time point at which a switch 33 is switched from the ON state to the OFF state to a time point at which another switch 33 is switched from the OFF state to the ON state during a time period of a light emission defect detection process. The switching interval is, for example, a time from a time point at which the first switch 331 is switched from the ON state to the OFF state to a time point at which the second switch 332 is switched from the OFF state to the ON state. The switching interval is preferably shorter than or equal to 100 ms. More preferably, the switching interval is shorter than or equal to 10 ms. Note that a time period during which the switch 33 is in the ON state is, for example, 30 ms.

Thus, it is possible to reduce a time period for performing detection of a light emission defect on the plurality of light-emitting elements 5.

When in a normal mode (when all of the two or more switches 33 are in the OFF state), the quantity of light detected by the photosensor 31 decreases, at least one of the plurality of light-emitting elements 5 may have a light emission defect. Thus, when the quantity of light detected by the photosensor 31 decreases, the detector 32 performs the light emission defect detection process. Specifically, when the detection value by the photosensor 31 decreases below the threshold, the processor 34 turns on the two or more switches 33 sequentially one by one to detect a light-emitting element 5 having a light emission defect.

Moreover, the detector 32 performs the light emission defect detection process at an initial stage of lighting of the plurality of light-emitting elements 5. In the present disclosure, "initial stage of lighting of the plurality of light-emitting elements 5" refers to a time point at or a time period during which luminous flux is stabilized after the light-emitting element 5 is started to be supplied with a current. For example, "initial stage of lighting of the plurality of light-emitting elements 5" is a period of several minutes or shorter from a time point at which the power supply P1 is turned on or dimming is performed. Specifically, "initial stage of lighting of the plurality of light-emitting elements 5" is a period within five to ten minutes of a time point at which the power supply P1 is turned on or dimming is performed. The "initial stage of lighting of the plurality of light-emitting elements 5" is preferably a period of three seconds or shorter from the time point at which the power supply P1 is turned on or dimming is performed. In other words, "initial stage of lighting of the plurality of light-emitting elements 5" refers to a time period from the time point at which the power supply P1 is turned on until a first time period elapses. The processor 34 turns on the two or more switches 33 sequentially one by one during the time period from the time point at which the power supply P1 is turned on until the first time period elapses to detect a light-emitting element 5 having a light emission defect. Thus, also when a light-emitting element 5 suddenly stops emitting light, the light-emitting element 5 having the light emission defect is detectable relatively early. Note that the processor 34 may be configured not to perform the light emission defect detection process from the time point at which the power supply P1 is turned on until a second time period (shorter than the first time period) elapses, because during this period, the quantity of light from the plurality of light-emitting elements 5 may be unstable.

When the processor 34 of the present embodiment detects a light-emitting element 5 having a light emission defect, the processor 34 causes the switch 33 corresponding to the light-emitting element 5 having the light emission defect to remain on during operation after the light emission defect detection process to short-circuit the both ends of the light-emitting element 5 having the light emission defect. For example, it is assumed that the second light-emitting element 52 of the plurality of light-emitting elements 5 has a light emission defect. In this case, when the processor 34 detects the light emission defect of the second light-emitting element 52, the processor 34 causes the second switch 332 corresponding to the second light-emitting element 52 to remain on during operation after the light emission defect detection process to short-circuit both ends of the second light-emitting element 52. A current from the lighting section 2 flows through the first light-emitting element 51, the phototransistor 37 of the second switch 332, the third light-emitting element 53, and the fourth light-emitting element 54. That is, no current flows through the second light-emitting element 52.

Thus, continuous use is possible in a state where the light-emitting element 5 having the light emission defect is electrically eliminated from the plurality of light-emitting elements 5. Moreover, a current no longer flows through the light-emitting element 5 having the light emission defect, and therefore, it is possible to reduce heat generated at the light-emitting element 5 having the light emission defect.

Moreover, when the processor 34 of the present embodiment detects a light-emitting element 5 having a light emission defect, the processor 34 causes the switch 33 corresponding to the light-emitting element 5 having the light emission defect to remain on during operation after the light emission defect detection process to short-circuit the both ends of the light-emitting element 5 having the light emission defect and to increase the current to be supplied to the plurality of light-emitting elements 5. For example, when the second light-emitting element 52 of the plurality of light-emitting elements 5 has a light emission defect, the second light-emitting element 52 emits no light, and thus, the number of light-emitting elements 5 that emit light is three among the plurality of light-emitting elements 5. Thus, as compared to a case where all the plurality of light-emitting elements 5 emit light, the quantity of light from the plurality of light-emitting elements 5 decreases. Here, when the processor 34 detects the light emission defect of the second light-emitting element 52, the processor 34 controls the lighting section 2 such that a current supplied from the lighting section 2 to the plurality of light-emitting elements 5 increases. For example, since the light emission defect reduces the quantity of light emitted from the plurality of light-emitting elements 5, the processor 34 performs a process of increasing a drive current to the plurality of light-emitting elements 5. The processor 34 outputs a signal to the DC/DC controller 223 of the DC/DC converter 22 to increase the drive current. When the number of light-emitting elements 5 is four, the processor 34 increases the drive current by about 30%. Note that when a second light emission defect occurs, the processor 34 does not increase the drive current when a first light emission defect occurs. That is, the processor 34 switches the drive current between two cases, namely, a normal case and a case where one or more light-emitting elements 5 have light emission defects.

Thus, a current flowing through the first light-emitting element 51, the third light-emitting element 53, and the fourth light-emitting element 54 increases, so that it is possible to increase the quantity of light emitted from the first light-emitting element 51, the third light-emitting element 53, and the fourth light-emitting element 54.

Thus, also in a state where the light-emitting element 5 having the light emission defect is eliminated from the plurality of light-emitting elements 5, it is possible to mitigate a reduction of the quantity of light emitted from the plurality of light-emitting elements 5.

In the present embodiment, the processor 34 stops the process of detecting the light emission defect while the lighting section 2 performs dimming control on the plurality of light-emitting elements 5. A period during which the lighting section 2 performs the dimming control is a time period during which the quantity of light emitted from the plurality of light-emitting elements 5 varies, and therefore, it is difficult to determine whether or not a change in the quantity of light is caused due to the light emission defect. Thus, while the dimming control is performed, the process of detecting the light emission defect is stopped.

Thus, while the quantity of light emitted from the plurality of light-emitting elements 5 varies due to the dimming control, the detection of the light emission defect is not performed, and therefore, it is possible to reduce the number of times of erroneous detection of the light emission defect.

On the other hand, the lighting section 2 does not perform the dimming control when the detector 32 performs a process of detecting the light emission defect. As described above, when the lighting section 2 performs the dimming control, the quantity of light emitted from the plurality of light-emitting elements 5 varies. Therefore, if while the detector 32 performs the process of detecting the light emission defect, the lighting section 2 performs the dimming control on the plurality of light-emitting elements 5, it is difficult to determine whether or not a change in the quantity of light is caused due to the light emission defect. Thus, when the detector 32 performs the process of detecting the light emission defect, the lighting section 2 does not perform the dimming control on the plurality of light-emitting elements 5.

As described above, while the process of detecting the light emission defect is performed, the dimming control that varies the quantity of light emitted from the plurality of light-emitting elements is not performed, and therefore, it is possible to reduce the number of times of erroneous detection of the light emission defect.

(5) Operation Example

An operation example of the illumination lighting apparatus 1 will be described below. Specifically, an operation example of the plurality of light-emitting elements 5 at an initial stage of lighting and an example in which light emitted from the plurality of light-emitting elements 5 changes are described.

Figure 7:
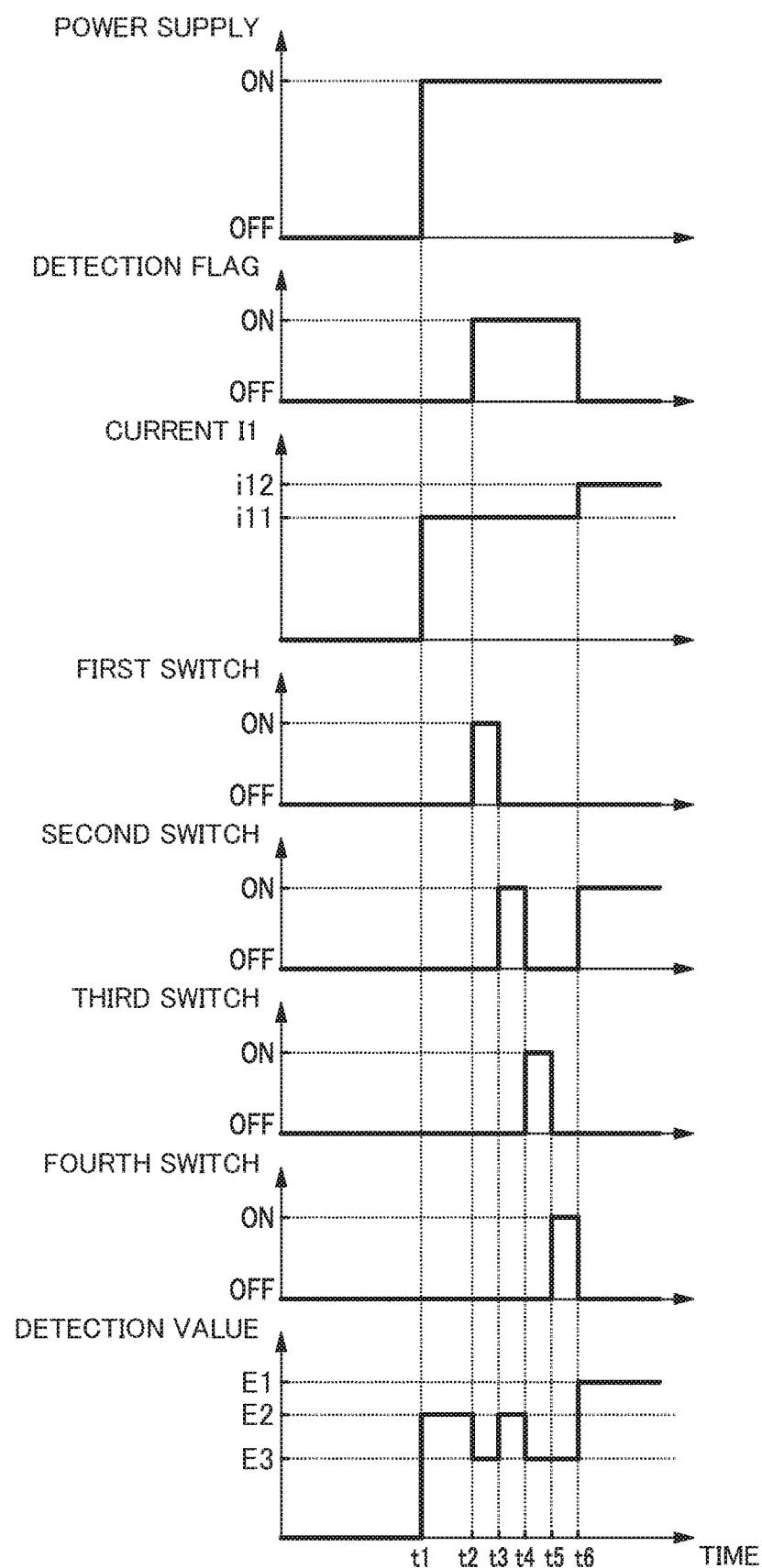

(5.1) Operation Example of Plurality of Light-Emitting Elements at Initial Stage of Lighting An operation example of the illumination lighting apparatus 1 of the plurality of light-emitting elements 5 at an initial stage of lighting will be described with reference to FIG. 7. In the example shown in FIG. 7, the second light-emitting element 52 has a light emission defect, and the first light-emitting element 51, the third light-emitting element 53, and the fourth light-emitting element 54 are normal.

When the power supply P1 is turned on, the lighting section 2 outputs the current I1 having a current value i11 to the plurality of light-emitting elements 5 (time t1). Since all of the two or more switches 33 are in the OFF state, the current flows through all the plurality of light-emitting elements 5, and all the plurality of light-emitting elements 5 emit light. The photosensor 31 detects the light from the plurality of light-emitting elements 5 and outputs a detection result as a detection value E2.

Then, during a period from turning on of the power supply P1 until a prescribed time period elapses, the detector 32 performs the light emission defect detection process (time t2 to time t6).

At time t2, the detector 32 switches the first switch 331 from the OFF state to the ON state. During a time period during which the first switch 331 is in the ON state (time t2 to time t3), both ends of the first light-emitting element 51 are short-circuited, and therefore, the current does not flow through the first light-emitting element 51. When the first light-emitting element 51 is normal, the first light-emitting element 51 emits no light when the current no longer flows through the first light-emitting element 51. Thus, the light emitted from the plurality of light-emitting elements 5 decreases. Thus, the photosensor 31 outputs a detection result as a detection value E3 which is smaller than the detection value E2. On the other hand, when the first light-emitting element 51 has a light emission defect, the light from the plurality of light-emitting elements 5 remains constant. Thus, the photosensor 31 outputs a detection result as the detection value E2.

At time t3, the detector 32 switches the first switch 331 from the ON state to the OFF state and switches the second switch 332 from the OFF state to the ON state. During a time period during which the second switch 332 is in the ON state (time t3 to time t4), the both ends of the second light-emitting element 52 are short-circuited, and therefore, the current does not flow through the second light-emitting element 52. However, since the second light-emitting element 52 has the light emission defect, the second light-emitting element 52 emits no light also before the both ends of the second light-emitting element 52 are short-circuited. Thus, the photosensor 31 outputs a detection result as the detection value E2.

At time t4, the detector 32 switches the second switch 332 from the ON state to the OFF state and switches the third switch 333 from the OFF state to the ON state. During a time period during which the third switch 333 is in the ON state (time t4 to time t5), both ends of the third light-emitting element 53 are short-circuited, and therefore, the current does not flow through the third light-emitting element 53. Since the third light-emitting element 53 is normal, the third light-emitting element 53 emits no light when the current no longer flows through the third light-emitting element 53. Thus, the photosensor 31 outputs a detection result as the detection value E3 which is smaller than the detection value E2.

At time t5, the detector 32 switches the third switch 333 from the ON state to the OFF state and switches the fourth switch 334 from the OFF state to the ON state. During a time period (time t5 to time t6) during which the fourth switch 334 is in the ON state, both ends of the fourth light-emitting element 54 are short-circuited, and therefore no current flows through the fourth light-emitting element 54. Since the fourth light-emitting element 54 is normal, the fourth light-emitting element 54 emits no light when no current flows through the fourth light-emitting element 54. Thus, the photosensor 31 outputs a detection result as the detection value E3 which is smaller than the detection value E2.

When the light emission defect detection process ends (time t6), the detector 32 switches the second switch 332 corresponding to the second light-emitting element 52 having the light emission defect to the ON state so as to short-circuit the both ends of the second light-emitting element 52. Then, the detector 32 controls the DC/DC converter 22 of the lighting section 2 such that the current I1 to the first light-emitting element 51, the third light-emitting element 53, and the fourth light-emitting element 54 has a current value i12. Thus, the quantity of light emitted from the plurality of light-emitting elements 5 in the case of short-circuiting the both ends of the light-emitting element 5 having the light emission defect can approximate the quantity of light in the case of all the plurality of light-emitting elements 5 being normal.

Thus, when the power supply P1 is turned on, the illumination lighting apparatus 1 performs the light emission defect detection process. The first switch 331 to the fourth switch 334 are sequentially turned on. In this case, only when the second switch 332 is turned on, the detection value by the photosensor 31 does not change. Therefore, it can be seen that the second light-emitting element 52 has a light emission defect. Then, the illumination lighting apparatus 1 turns on the second switch 332 to change the current value of the current I1 from the current value i11 to the current value i12.

(5.2) Operation Example in Case of Reduced Detection Value by Photosensor

Figure 8:
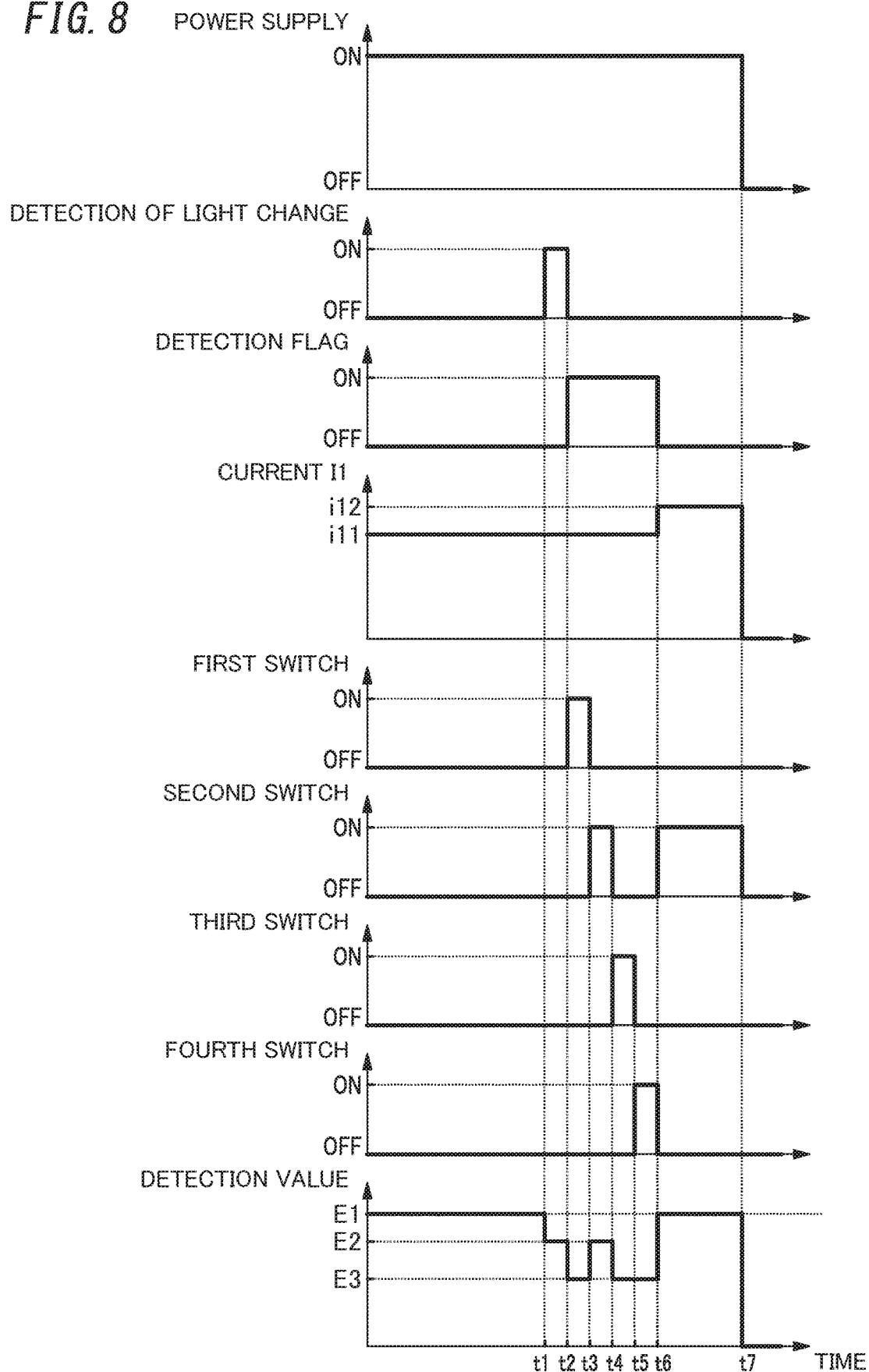
FIG. 8 is a schematic view illustrating a function when the illumination lighting apparatus is normally lit.

With reference to FIG. 8, an operation example of the illumination lighting apparatus 1 in a case of a reduced detection value by the photosensor 31 will be described. In the example shown in FIG. 8, the second light-emitting element 52 has a light emission defect, and the first light-emitting element 51, the third light-emitting element 53, and the fourth light-emitting element 54 are normal.

In the normal mode, the lighting section 2 outputs the current I1 having the current value i11 to the plurality of light-emitting elements 5. Since all of the two or more switches 33 are in the OFF state, the current flows through all the plurality of light-emitting elements 5, and all the plurality of light-emitting elements 5 emit light. The photosensor 31 detects the light from the plurality of light-emitting elements 5 and outputs a detection result as a detection value E1.

When at time t1, the quantity of light emitted from the plurality of light-emitting elements 5 decreases, the detection result by the photosensor 31 decreases from the detection value E1 to the detection value E2. When detecting a change of the light, the detector 32 performs the light emission defect detection process (time t2 to time t6).

At time t2, the detector 32 switches the first switch 331 from the OFF state to the ON state. During the time period during which the first switch 331 is in the ON state (time t2 to time t3), the both ends of the first light-emitting element 51 are short-circuited, and therefore, the current does not flow through the first light-emitting element 51. When the first light-emitting element 51 is normal, the first light-emitting element 51 emits no light when the current no longer flows through the first light-emitting element 51. Thus, the light emitted from the plurality of light-emitting elements 5 decreases. Thus, the photosensor 31 outputs a detection result as the detection value E3 which is smaller than the detection value E2.

At time t3, the detector 32 switches the first switch 331 from the ON state to the OFF state and switches the second switch 332 from the OFF state to the ON state. During the time period during which the second switch 332 is in the ON state (time t3 to time t4), the both ends of the second light-emitting element 52 are short-circuited, and therefore, the current does not flow through the second light-emitting element 52. However, since the second light-emitting element 52 has the light emission defect, the second light-emitting element 52 emits no light also before the both ends of the second light-emitting element 52 are short-circuited. Thus, the photosensor 31 outputs a detection result as the detection value E2.

At time t4, the detector 32 switches the second switch 332 from the ON state to the OFF state and switches the third switch 333 from the OFF state to the ON state. During the time period during which the third switch 333 is in the ON state (time t4 to time t5), the both ends of the third light-emitting element 53 are short-circuited, and therefore, the current does not flow through the third light-emitting element 53. Since the third light-emitting element 53 is normal, the third light-emitting element 53 emits no light when the current no longer flows through the third light-emitting element 53. Thus, the photosensor 31 outputs a detection result as the detection value E3 which is smaller than the detection value E2.

At time t5, the detector 32 switches the third switch 333 from the ON state to the OFF state and switches the fourth switch 334 from the OFF state to the ON state. During a time period (time t5 to time t6) during which the fourth switch 334 is in the ON state, the both ends of the fourth light-emitting element 54 are short-circuited, and therefore the current does not flow through the fourth light-emitting element 54. Since the fourth light-emitting element 54 is normal, the fourth light-emitting element 54 emits no light when the current no longer flows through the fourth light-emitting element 54. Thus, the photosensor 31 outputs a detection result as the detection value E3 which is smaller than the detection value E2.

When the light emission defect detection process ends (time t6), the detector 32 switches the second switch 332 corresponding to the second light-emitting element 52 having the light emission defect to the ON state so as to short-circuit the both ends of the second light-emitting element 52. Then, the detector 32 controls the DC/DC converter 22 of the lighting section 2 such that the current I1 to the first light-emitting element 51, the third light-emitting element 53, and the fourth light-emitting element 54 has the current value i12. Thus, the quantity of light emitted from the plurality of light-emitting elements 5 in the case of short-circuiting the both ends of the light-emitting element 5 having the light emission defect can approximate the quantity of light in the case of all the plurality of light-emitting elements 5 being normal.

When the power supply P1 is turned OFF (time t7), current supply to the plurality of light-emitting elements 5 is also stopped. Moreover, the second switch 332 is brought into the OFF state.

Thus, the light emission defect of the second light-emitting element 52 reduces the detection value by the photosensor 31, and thereby, the illumination lighting apparatus 1 performs the light emission defect detection process. The first switch 331 to the fourth switch 334 are sequentially turned on. In this case, only when the second switch 332 is turned on, the detection value by the photosensor 31 does not change. Therefore, it can be seen that the second light-emitting element 52 has a light emission defect. Then, the illumination lighting apparatus 1 turns on the second switch 332 to change the current value of the current I1 from the current value i11 to the current value i12.

(6) Operation of Illumination Lighting Apparatus

Figure 9:
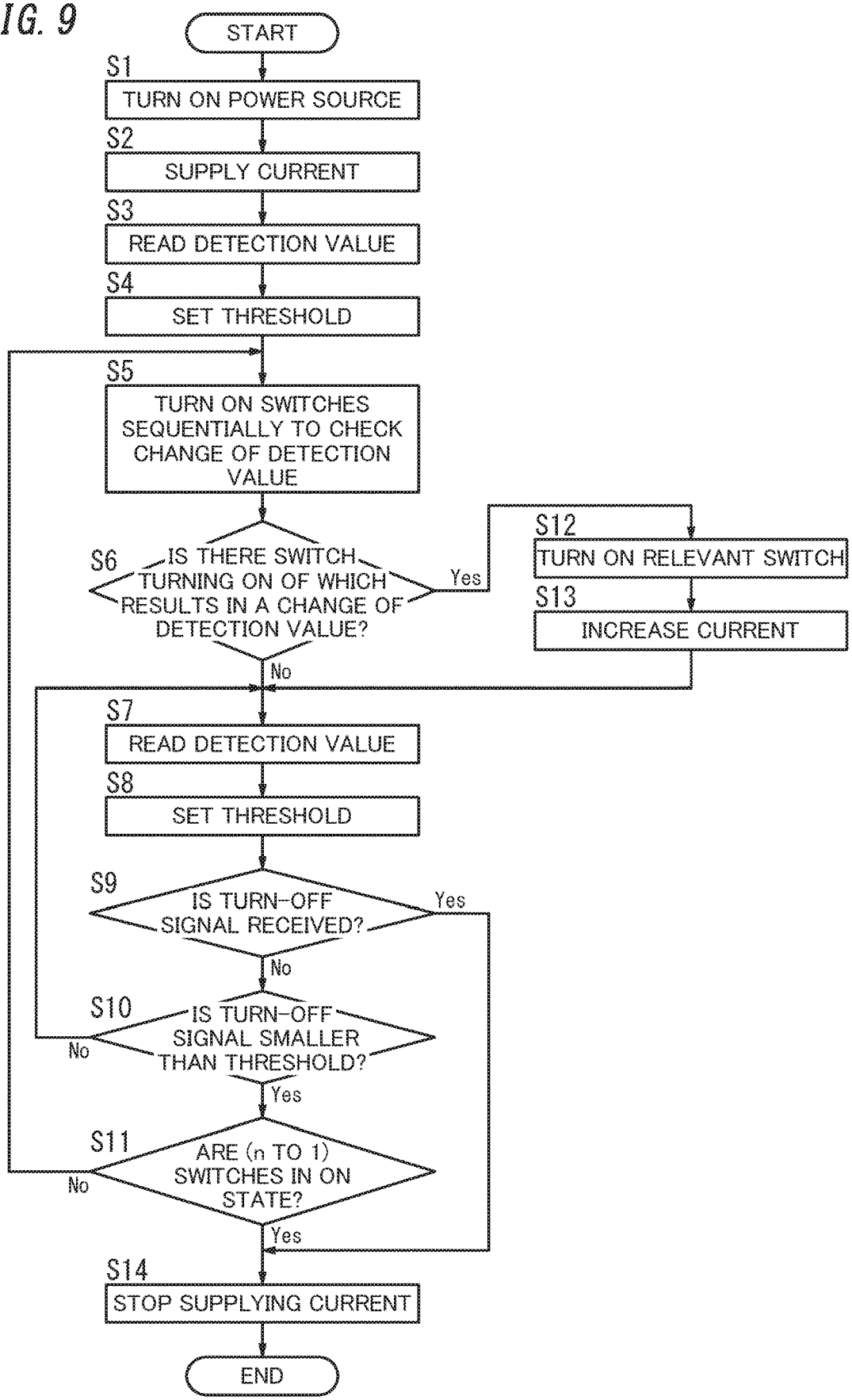
FIG. 9 is a flowchart illustrating operation of the illumination lighting apparatus.

With reference to FIG. 9, operation of the illumination lighting apparatus 1 (illumination lighting method by using the illumination lighting apparatus 1) will be described below.

The power supply P1 is turned on to supply electric power to the illumination lighting apparatus 1 (step S1). In the illumination lighting apparatus 1, the processor 34 of the detector 32 counts time from the initial stage of lighting of the plurality of light-emitting elements 5. Then, the illumination lighting apparatus 1 starts supplying the current I1 to the plurality of light-emitting elements 5 (step S2). The illumination lighting apparatus 1 supplies the current I1 having the current value i11 to the plurality of light-emitting elements 5. The current value i11 is a constant value.

In the illumination lighting apparatus 1, the processor 34 measures light emitted from the plurality of light-emitting elements 5 and detected by the photosensor 31 (step S3). The photosensor 31 detects the light emitted from the plurality of light-emitting elements 5 and outputs a detection value to the processor 34. The processor 34 sets a threshold (step S4). The processor 34 sets, as the threshold, for example, a value 0.9 times as large as a current detection value. The processor 34 changes the threshold depending on the number of the light-emitting elements 5.

The processor 34 turns on the two or more switches 33 sequentially one by one and checks the detection value by the photosensor 31 (step S5). If there is no switch 33 turning on of which does not result in a change of the detection value by the photosensor 31 ("NO" in step S6), the processor 34 reads the light emitted from the plurality of light-emitting elements 5 and detected by the photosensor 31 (step S7). The processor 34 newly sets a threshold (step S8). The processor 34 sets, as the threshold, for example, a value 0.9 times as large as a currently measured value (the most recent value). The threshold is set based on the most recent value, and thereby, it is possible to reduce the number of times of erroneous detection occurring due to a gentle change such as a change caused by a temperature property of the light-emitting element 5 or a change due to aging of the light-emitting element 5.

Then, when the dimming signal receiver 23 does not receive a turn-off signal for turning off the plurality of light-emitting elements 5 ("No" in step S9), the processor 34 compares the detection value by the photosensor 31 with the threshold (step S10). When the detection value by the photosensor 31 is larger than or equal to the threshold ("No" in step S10), the process returns to step S7.

If, when the detection value by the photosensor 31 is smaller than the threshold ("Yes" in step S10), a corresponding light-emitting element 5 has a light emission defect and the number of switches 33 in the ON state is not three ("No" in step S11), the processor 34 turns on the two or more switches 33 sequentially one by one and checks the detection value by the photosensor 31 (step S5).

In step S6, if there is a switch 33 turning on of which does not result in a change of the detection value by the photosensor 31 ("Yes" in step S6), the processor 34 turns on the switch 33 (step S12). Both ends of the light-emitting element 5 corresponding to the switch 33 are short-circuited. Moreover, the processor 34 increases the current I1 to the plurality of light-emitting elements 5 (step S13). Then, the process proceeds to step S7.

In step S9, if the dimming signal receiver 23 receives a turn-off signal ("Yes" in step S9), supplying of electric power from the power supply P1 is stopped (step S14). Similarly, also when in step S11, the corresponding light-emitting element 5 has a light emission defect and the number of switches 33 in the ON state is three ("Yes" in step S11), supplying of electric power from the power supply P1 is stopped (step S14).

The operation enables the illumination lighting apparatus 1 to detect a light-emitting element 5 having a light emission defect. That is, the illumination lighting apparatus 1 can detect a light-emitting element 5 through which a current flows but which emits no light.

(7) Effects

The illumination lighting apparatus 1 includes the detector 32. The detector 32 is configured to detect the light emission defect occurring in the plurality of light-emitting elements 5 if, when the two or more switches 33 are turned on one by one, the quantity of light emitted from the plurality of light-emitting elements 5 and detected by one photosensor 31 does not change. Thus, it is possible to accurately detect a light-emitting element 5 through which a current continues to flow but which emits no light, that is, a light-emitting element 5 having a light emission defect. As compared to a case where a light-emitting element 5 having a light emission defect is detected based on a current supplied to the plurality of light-emitting elements 5 or a voltage applied to the plurality of light-emitting elements 5, it is possible to increase the detection accuracy of the light-emitting element 5 having the light emission defect.

In the illumination lighting apparatus 1, the detector 32 performs the light emission defect detection process at an initial stage of lighting of the plurality of light-emitting elements 5. Thus, also when a light-emitting element 5 suddenly stops emitting light, the light-emitting element 5 having the light emission defect is detectable relatively early. Moreover, the light emission defect detection process is performed at an initial stage of each time of lighting of the plurality of light-emitting elements 5, and thereby, it is possible to reduce the number of times of erroneous detection of the light emission defect of the light-emitting element 5 and it is possible to reduce the number of times that the light emission defect is not detected.

The illumination lighting apparatus 1 includes the two or more switches 33 corresponding to the plurality of light-emitting elements 5 on a one-to-one basis. Thus, it is possible to immediately detect a light-emitting element 5 having a light emission defect if, when a switch 33 is turned on, the quantity of light emitted from the plurality of light-emitting elements 5 does not change.

In the illumination lighting apparatus 1, when the processor 34 detects the light-emitting element 5 having the light emission defect, the processor 34 short-circuits both ends of the light-emitting element 5 having the light emission defect. Thus, continuous use is possible in a state where the light-emitting element 5 having the light emission defect is electrically eliminated from the plurality of light-emitting elements 5. Moreover, a current no longer flows through the light-emitting element 5 having the light emission defect, and therefore, it is possible to reduce heat generated at the light-emitting element 5 having the light emission defect.

In the illumination lighting apparatus 1, when the processor 34 detects the light-emitting element 5 having the light emission defect, the processor 34 short-circuits the both ends of the light-emitting element 5 having the light emission defect and increases a current to be supplied to the plurality of light-emitting elements 5. Thus, also in a state where the light-emitting element 5 having the light emission defect is eliminated from the plurality of light-emitting elements 5, it is possible to mitigate a reduction of the quantity of light emitted from the plurality of light-emitting elements 5.

In the illumination lighting apparatus 1, the threshold is set based on the most recent value, and thereby, it is possible to reduce the number of times of erroneous detection occurring due to a gentle change such as a change caused by a temperature property of the light-emitting element 5 or a change due to aging of the light-emitting element 5.

In the illumination lighting apparatus 1, when the quantity of light detected by the photosensor 31 decreases, the detector 32 performs the light emission defect detection process. Thus, when the light emission defect occurs, the light emission defect can be detected at an initial stage.

In the illumination lighting apparatus 1, while the lighting section 2 performs the dimming control, the detector 32 stops the light emission defect detection process. Thus, while the quantity of light emitted from the plurality of light-emitting elements 5 varies due to the dimming control, the detection of the light emission defect is not performed, and therefore, it is possible to reduce the number of times of erroneous detection of the light emission defect. Note that the detector 32 receives a signal via a control line 282 from the DC/DC controller 223 of the DC/DC converter 22, the signal representing whether or not the lighting section 2 performs the dimming control.

In the illumination lighting apparatus 1, while the detector 32 performs the light emission defect detection process, the lighting section 2 does not perform the dimming control. Thus, while the process of detecting the light emission defect is performed, the dimming control that varies the quantity of light emitted from the plurality of light-emitting elements 5 is not performed, and therefore, it is possible to reduce the number of times of erroneous detection of the light emission defect.

In the illumination lighting apparatus 1, a switching interval for turning on the switch 33 is shorter than or equal to 100 ms. Thus, it is possible to reduce a time period for performing detection of a light emission defect on the plurality of light-emitting elements 5.

The illumination fixture 7 is provided with the optical fiber 8. Thus, it is possible to dispose the light outputting section 9 in various places regardless of the disposition of the illumination device 4.

(8) Variation

Variations of the embodiment will be described below.

Figure 10:
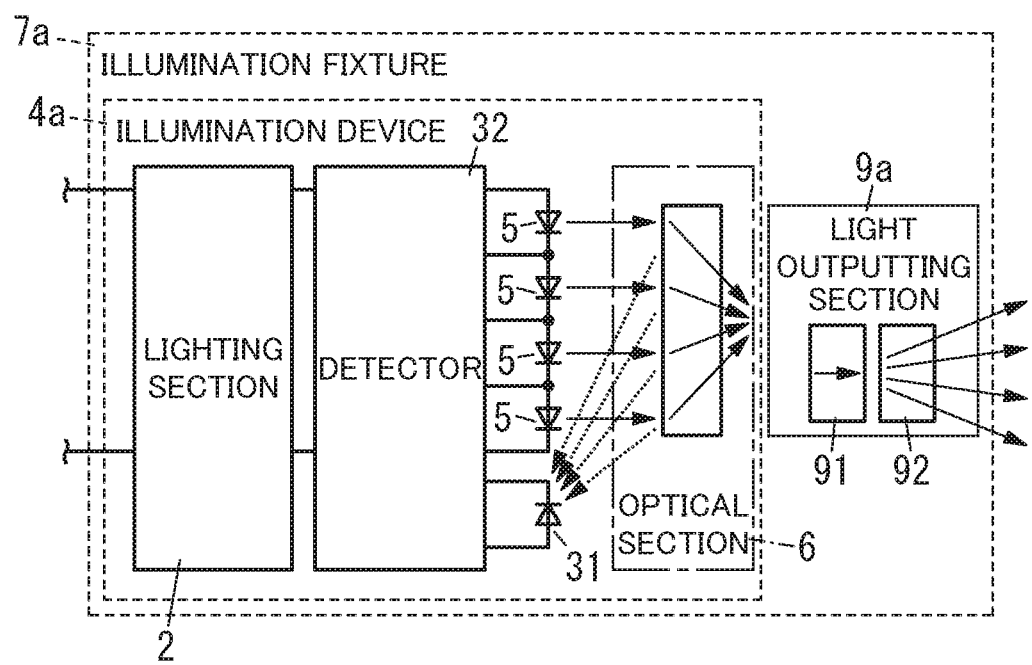
FIG. 10 is a schematic view illustrating a function of an illumination fixture of a variation of the embodiment.

In the present embodiment, the illumination device 4 and the light outputting section 9 are separately provided as illustrated in FIG. 5. However, as a variation of the present embodiment, an illumination device 4a and a light outputting section 9a may be integrated with each other as illustrated in FIG. 10. An illumination fixture 7a according to the present variation includes the illumination device 4a and the light outputting section 9a. Components of the illumination device 4a and components of the light outputting section 9a are accommodated in one housing. Since the illumination device 4a and the light outputting section 9a are provided integrally with each other, the optical fiber 8 (see FIG. 6) may be omitted. Note that the illumination device 4a has a similar function to the illumination device 4 except that a housing 41 (see FIG. 6) is provided. The light outputting section 9a has a similar function to the light outputting section 9 except that a housing 93 (see FIG. 6) is provided.

Each of the plurality of light-emitting elements 5 may be a solid-state light-emitting element other than a laser diode. Each of the plurality of light-emitting elements 5 may be, for example, a light emitting diode (LED).

The photosensor 31 may be light detection element other than the photodiode. The photosensor 31 may be, for example, a phototransistor, a photovoltaic cell, or a CdS cell.

The two or more switches 33 do not necessarily have to correspond to the plurality of light-emitting elements 5 on a one-to-one basis, and at least one of the two or more switches 33 may correspond to a plurality of light-emitting elements 5. For example, each of the first switch 331 to the fourth switch 334 may correspond to different two or more light-emitting elements 5. Alternatively, the first switch 331 may correspond to the two or more light-emitting elements 5 and each of the second switch 332, the third switch 333, and the fourth switch 334 may correspond to one light-emitting element 5.

The AC/DC converter 21 and the DC/DC converter 22 may be integrated with each other and may form a circuit configured to output a constant current which is a direct current based on an input voltage from the power supply P1.

The AC/DC converter 21 may be a non-isolated converter. The AC/DC converter 21 is not limited to a flyback converter but may be a chopper converter.

The DC/DC converter 22 is not limited to a chopper converter but may be an isolated converter. The DC/DC converter 22 may be a step-up chopper or step-up/down chopper depending on the relationship between the voltage of the light-emitting element 5 and the output voltage of the AC/DC converter 21.

Each of the variations provides effects similar to those provided by the present embodiment.

The embodiment and variations described above are included in various embodiments and variations of the present disclosure. Various modifications may be made to the embodiment and variations described above depending on design and the like as long as the object of the present disclosure is achieved.

(Aspects)

Based on the embodiment and variations described above, the following aspects are disclosed.

An illumination lighting apparatus (1) of a first aspect is configured to light a plurality of light-emitting elements (5) connected in series to each other. The illumination lighting apparatus (1) includes one photosensor (31) and a detector (32). The one photosensor (31) is configured to detect light emitted from the plurality of light-emitting elements (5). The detector (32) is configured to perform detection of a light emission defect on the plurality of light-emitting elements (5) based on the light detected by the one photosensor (31). The detector (32) is configured to perform a detection process (light emission defect detection process) at an initial stage of lighting of the plurality of light-emitting elements (5).

With the illumination lighting apparatus (1) of the first aspect, it is possible to accurately detect a light-emitting element (5) through which a current continues to flow but which emits no light, that is, a light-emitting element (5) having a light emission defect. As compared to a case where a light-emitting element (5) having a light emission defect is detected based on a current supplied to the plurality of light-emitting elements (5) or a voltage applied to the plurality of light-emitting elements (5), it is possible to increase the detection accuracy of the light-emitting element (5) having the light emission defect.

Moreover, with the illumination lighting apparatus (1) of the first aspect, it is possible to relatively early detect a light-emitting element (5) having a light emission defect even when the light-emitting element (5) suddenly stops emitting light. Moreover, the detection process is performed at an initial stage of each time of lighting of the plurality of light-emitting elements (5), thereby reducing the number of times of erroneous detection of the light emission defect of the light-emitting element (5) and reducing the number of times that the light emission defect is not detected.

In an illumination lighting apparatus (1) of a second aspect referring to the first aspect, the plurality of light-emitting elements (5) are divided into two or more groups each including at least one light-emitting element (5). The detector (32) includes two or more switches (33) and a processor (34). The two or more switches (33) are connected in parallel to the plurality of light-emitting elements (5). The two or more switches (33) correspond to the two or more groups on a one-to-one basis. Each of the two or more switches (33) is connected in parallel to a corresponding one of the two or more groups. The processor (34) turns on the two or more switches (33) sequentially one by one to detect the light emission defect from the plurality of light-emitting elements (5).

In an illumination lighting apparatus (1) of a third aspect reference to the second aspect, the two or more switches (33)

correspond to the plurality of light-emitting elements (5) on a one-to-one basis and are each connected in parallel to a corresponding one of the plurality of light-emitting elements (5).

With the illumination lighting apparatus (1) of the third aspect, when a quantity of light does not change in a case of turning on a switch (33), it is possible to immediately detect a light-emitting element (5) having a light emission defect.

In an illumination lighting apparatus (1) of a fourth aspect referring to the second or third aspect, when the processor (34) detects a light-emitting element (5) having the light emission defect, the processor (34) causes a switch (33) of the two or more switches which corresponds to the light-emitting element (5) having the light emission defect to remain on during operation after the detection process to short-circuit both ends of the light-emitting element (5) having the light emission defect.

In the illumination lighting apparatus (1) of the fourth aspect, continuous use is possible in a state where the light-emitting element (5) having the light emission defect is electrically eliminated from the plurality of light-emitting elements (5). Moreover, a current no longer flows through the light-emitting element (5) having the light emission defect, and therefore, it is possible to reduce heat generated at the light-emitting element (5) having the light emission defect.

In an illumination lighting apparatus (1) of a fifth aspect referring to the fourth aspect, when the processor (34) detects the light-emitting element (5) having the light emission defect, the processor (34) causes the switch (33) corresponding to the light-emitting element (5) having the light emission defect to remain on during the operation after the detection process to short-circuit the both ends of the light-emitting element (5) having the light emission defect and increases a current to be supplied to the plurality of light-emitting elements (5) except for the light-emitting element (5) having the light emission defect.

With the illumination lighting apparatus (1) of the fifth aspect, also in a state where the light-emitting element (5) having the light emission defect is eliminated from the plurality of light-emitting elements (5), it is possible to mitigate a reduction of the quantity of light emitted from the plurality of light-emitting elements (5).

In an illumination lighting apparatus (1) of a sixth aspect referring to any one of the second to fifth aspects, the processor (34) turns on the two or more switches (33) sequentially one by one, and when any of the two or more switches (33) is switched between an OFF state and an ON state but a quantity of light detected by the one photosensor (31) remains larger than or equal to a threshold, the processor (34) detects a light-emitting element (5) having the light emission defect. The threshold is a value smaller than the quantity of light detected most recently by the one photosensor (31).

With the illumination lighting apparatus (1) of the sixth aspect, the threshold is set based on the most recent value, and thereby, it is possible to reduce the number of times of erroneous detection occurring due to a gentle change such as a change caused by a temperature property of the light-emitting element (5) or a change due to aging of the light-emitting element (5).

In an illumination lighting apparatus (1) of a seventh aspect referring to any one of the second to sixth aspects, the processor (34) turns on the two or more switches (33) sequentially one by one at a switching interval shorter than or equal to 100 ms.

With the illumination lighting apparatus (1) of a seventh aspect, it is possible to reduce a time period for performing detection of a light emission defect on the plurality of light-emitting elements (5).

In an illumination lighting apparatus (1) of an eighth aspect referring to any one of claims 1 to 7, the detector (32) performs a detection process when a quantity of light detected by the one photosensor (31) decreases.

With the illumination lighting apparatus (1) of the eighth aspect, when the light emission defect occurs, the light emission defect can be detected at an initial stage.

An illumination lighting apparatus (1) of a ninth aspect referring to any one of the first to eighth aspects further includes a lighting section (2). The lighting section (2) has a dimming function of turning on and dimming the plurality of light-emitting elements (5). The detector (32) is configured to stop the detection process while the lighting section (2) performs dimming control on the plurality of light-emitting elements (5).

With the illumination lighting apparatus (1) of the ninth aspect, while the quantity of light emitted from the plurality of light-emitting elements (5) varies due to the dimming control, the detection of the light emission defect is not performed, and therefore, it is possible to reduce the number of times of erroneous detection of the light emission defect.

An illumination lighting apparatus (1) of a tenth aspect referring to any one of the first to ninth aspects further includes a lighting section (2). The lighting section (2) has a dimming function of turning on and dimming the plurality of light-emitting elements (5). The lighting section (2) is configured to forgo dimming control on the plurality of light-emitting elements (5) while the detector (32) performs the detection process.

With the illumination lighting apparatus (1) of the tenth aspect, while the process of detecting the light emission defect is performed, the dimming control that varies the quantity of light emitted from the plurality of light-emitting elements (5) is not performed, and therefore, it is possible to reduce the number of times of erroneous detection of the light emission defect.

In an illumination lighting apparatus (1) of an eleventh aspect referring to any one of the first to tenth aspects, each of the plurality of light-emitting elements (5) is a laser diode.

An illumination lighting apparatus (1) of a twelfth aspect referring to any one of the first to eleventh aspects, the initial stage of lighting of the plurality of light-emitting elements is a period within ten minutes of a time point at which the power supply is turned on or dimming is performed.

An illumination device (4; 4a) of a thirteenth aspect includes the illumination lighting apparatus (1) of any one of the first to twelfth aspects, the plurality of light-emitting elements (5), and an optical component (6). The optical component (6) is configured to guide the light emitted from the plurality of light-emitting elements (5).

With the illumination device (4; 4a) of the thirteenth aspect, it is possible in the illumination lighting apparatus (1) to accurately detect a light-emitting element (5) through which a current continues to flow but which emits no light, that is, a light-emitting element (5) having a light emission defect. As compared to a case where a light-emitting element (5) having a light emission defect is detected based on a current supplied to the plurality of light-emitting elements (5) or a voltage applied to the plurality of light-emitting elements (5), it is possible to increase the detection accuracy of the light-emitting element (5) having the light emission defect.

In an illumination device (4; 4a) of a fourteenth aspect referring to the thirteenth aspect, the one photosensor (31) is configured to detect light which is included in the light emitted from the plurality of light-emitting elements (5) and which is reflected off the optical component (6).

With the illumination device (4; 4a) of the fourteenth aspect, it is possible to perform detection of a light-emitting element (5) having a light emission defect based on light in a state similar to a state of actually emitted light.

An illumination fixture (7; 7a) of a fifteenth aspect includes the illumination device (4; 4a) of the thirteenth aspect and a light outputting section (9; 9a). The light outputting section (9; 9a) is configured to output the light guided from the optical component (6) of the illumination device (4; 4a).

With the illumination fixture (7; 7a) of the fifteenth aspect, it is possible in the illumination lighting apparatus (1) to accurately detect a light-emitting element (5) through which a current continues to flow but which emits no light, that is, a light-emitting element (5) having a light emission defect. As compared to a case where a light-emitting element (5) having a light emission defect is detected based on a current supplied to the plurality of light-emitting elements (5) or a voltage applied to the plurality of light-emitting elements (5), it is possible to increase the detection accuracy of the light-emitting element (5) having the light emission defect.

An illumination fixture (7) of a sixteenth aspect referring to the fifteenth aspect further includes an optical fiber (8). The optical fiber (8) is configured to guide the light from the optical component (6) of the illumination device (4) to the light outputting section (9).

With the illumination fixture (7) of the sixteenth aspect, it is possible to dispose the light outputting section (9) in various places regardless of the disposition of the illumination device (4).

In an illumination lighting apparatus (1) of a seventeenth aspect referring to any one of the first to twelfth aspects, each of the two or more switches (33) is a semiconductor relay.

In an illumination lighting apparatus (1) of an eighteenth aspect referring to the seventeenth aspect, each of the two or more switches (33) includes a light-emitting diode (36) and a phototransistor (37) serving as a light reception element.

In an illumination lighting apparatus (1) of a nineteenth aspect referring to any one of the first to twelfth aspects, the processor (34) performs, on each of the plurality of light-emitting elements (5), detection of an oscillation defect as the light emission defect in the plurality of light-emitting elements (5). In the oscillation defect, the light-emitting element (5) emitting no light although a current continues to flow through the light-emitting element (5).

The invention claimed is:

1. An illumination lighting apparatus configured to light a plurality of light-emitting elements connected in series to each other, the illumination lighting apparatus comprising:
   one photosensor configured to detect light emitted from the plurality of light-emitting elements; and
   a detector configured to perform a detection process of detecting a light emission defect in the plurality of light-emitting elements based on the light detected by the one photosensor,
   the detector being configured to perform the detection process at an initial stage of lighting of the plurality of light-emitting elements,
   the one photosensor being configured to detect light which is included in the light emitted from the plurality of light-emitting elements and which is reflected off an optical component configured to guide the light emitted from the plurality of light-emitting elements,
   the plurality of light-emitting elements are divided into two or more groups each including at least one light-emitting element,
   the detector includes
      two or more switches connected in parallel to the plurality of light-emitting elements, the two or more switches corresponding to the two or more groups on a one-to-one basis, each of the two or more switches being connected in parallel to a corresponding one of the two or more groups, and
      a processor configured to turn on the two or more switches sequentially one by one during the detection process to detect the light emission defect from the plurality of light-emitting elements, and
   each of the two or more switches includes
      a light-emitting diode connected to the processor, and
      a phototransistor connected in parallel to the corresponding one.

2. The illumination lighting apparatus of claim 1, wherein the two or more switches correspond to the plurality of light-emitting elements on a one-to-one basis and are each connected in parallel to a corresponding one of the plurality of light-emitting elements.

3. The illumination lighting apparatus of claim 2, wherein when the processor detects a light-emitting element having the light emission defect, the processor causes a switch of the two or more switches which corresponds to the light-emitting element having the light emission defect to remain on during operation after the detection process to short-circuit both ends of the light-emitting element having the light emission defect.

4. The illumination lighting apparatus of claim 1, wherein when the processor detects a light-emitting element having the light emission defect, the processor causes a switch of the two or more switches which corresponds to the light-emitting element having the light emission defect to remain on during operation after the detection process to short-circuit both ends of the light-emitting element having the light emission defect.

5. The illumination lighting apparatus of claim 4, wherein when the processor detects the light-emitting element having the light emission defect, the processor causes the switch corresponding to the light-emitting element having the light emission defect to remain on during the operation after the detection process to short-circuit the both ends of the light-emitting element having the light emission defect and increases a current to be supplied to the plurality of light-emitting elements except for the light-emitting element having the light emission defect.

6. The illumination lighting apparatus of claim 1, wherein the processor turns on the two or more switches sequentially one by one, and
   when any of the two or more switches is switched between an OFF state and an ON state but a quantity of light detected by the one photosensor remains larger than or equal to a threshold, the processor detects a light-emitting element having the light emission defect, and
   the threshold is a value smaller than the quantity of light detected most recently by the one photosensor.

7. The illumination lighting apparatus of claim 1, wherein the processor turns on the two or more switches sequentially one by one at a switching interval shorter than or equal to 100 ms.

8. The illumination lighting apparatus of claim 1, wherein the detector is configured to perform the detection process when a quantity of light detected by the one photosensor decreases.

9. The illumination lighting apparatus of claim 1, wherein each of the plurality of light-emitting elements is a laser diode.

10. The illumination lighting apparatus of claim 1, wherein
the initial stage of lighting of the plurality of light-emitting elements is a period within ten minutes of a time point at which the power supply is turned on or dimming is performed.

11. An illumination device, comprising:
the illumination lighting apparatus of claim 1;
the plurality of light-emitting elements; and
the optical component.

12. An illumination fixture, comprising:
the illumination device of claim 11; and
a light outputting section configured to output the light guided from the optical component of the illumination device.

13. The illumination fixture of claim 12, further comprising optical fiber configured to guide the light from the optical component of the illumination device to the light outputting section.

14. The illumination lighting apparatus of claim 2, wherein
each of the two or more switches is a semiconductor relay.

15. An illumination lighting apparatus configured to light a plurality of light-emitting elements connected in series to each other, the illumination lighting apparatus comprising:
one photosensor configured to detect light emitted from the plurality of light-emitting elements;
a detector configured to perform a detection process of detecting a light emission defect in the plurality of light-emitting elements based on the light detected by the one photosensor; and
a lighting section having a dimming function of turning on and dimming the plurality of light-emitting elements, wherein
the detector being configured to perform the detection process at an initial stage of lighting of the plurality of light-emitting elements, and
the detector is configured to stop the detection process while the lighting section performs dimming control on the plurality of light-emitting elements.

16. An illumination lighting apparatus configured to light a plurality of light-emitting elements connected in series to each other, the illumination lighting apparatus comprising:
one photosensor configured to detect light emitted from the plurality of light-emitting elements;
a detector configured to perform a detection process of detecting a light emission defect in the plurality of light-emitting elements based on the light detected by the one photosensor; and
a lighting section having a dimming function of turning on and dimming the plurality of light-emitting elements, wherein
the detector being configured to perform the detection process at an initial stage of lighting of the plurality of light-emitting elements, and
the lighting section is configured to forgo dimming control on the plurality of light-emitting elements while the detector performs the detection process.

17. An illumination lighting apparatus configured to light a plurality of light-emitting elements connected in series to each other, the illumination lighting apparatus comprising:
one photosensor configured to detect light emitted from the plurality of light-emitting elements; and
a detector configured to perform a detection process of detecting a light emission defect in the plurality of light-emitting elements based on the light detected by the one photosensor,
the detector being configured to perform the detection process at an initial stage of lighting of the plurality of light-emitting elements,
the plurality of light-emitting elements are divided into two or more groups each including at least one light-emitting element,
the detector includes
two or more switches connected in parallel to the plurality of light-emitting elements, the two or more switches corresponding to the two or more groups on a one-to-one basis, each of the two or more switches being connected in parallel to a corresponding one of the two or more groups, and
a processor configured to turn on the two or more switches sequentially one by one during the detection process to detect the light emission defect from the plurality of light-emitting elements, and
the processor is configured to perform, on each of the plurality of light-emitting elements, detection of an oscillation defect as the light emission defect in the at least one light-emitting elements included in each of the two or more groups, and in the oscillation defect, the light-emitting element emitting no light although a current flows through the light-emitting element.

* * * * *